United States Patent [19]

Takahashi et al.

[11] Patent Number: 5,682,102
[45] Date of Patent: Oct. 28, 1997

[54] ELECTROSTATIC CAPACITY MEASURING INSTRUMENT FOR STATOR WINDING OF ELECTRIC ROTATING MACHINE

[75] Inventors: Shinji Takahashi; Kazuo Tashiro, both of Yokohama; Hideyuki Shimada, Tokyo; Susumu Nagano; Hiroshi Hasegawa, both of Yokohama, all of Japan

[73] Assignee: Kabushiki Kaisha Toshiba, Kawasaki, Japan

[21] Appl. No.: 634,913

[22] Filed: Apr. 19, 1996

[30] Foreign Application Priority Data

Aug. 8, 1995 [JP] Japan .................... 7-202085

[51] Int. Cl.$^6$ .................................... G01R 31/34
[52] U.S. Cl. .................. 324/545; 324/772; 324/689; 340/648
[58] Field of Search .................. 340/648, 647; 324/772, 545, 689

[56] References Cited

U.S. PATENT DOCUMENTS

| 5,032,826 | 7/1991 | Miller | 324/545 |
| 5,055,775 | 10/1991 | Scherz | 324/772 |
| 5,252,927 | 10/1993 | Bruhlmeier | 324/772 |
| 5,262,717 | 11/1993 | Bolegoh | 324/772 |
| 5,365,166 | 11/1994 | Dailey | 324/545 |
| 5,557,216 | 9/1996 | Dailey | 324/772 |

OTHER PUBLICATIONS

Lloyd R. Brown, et al., "Montana Power Company's experience With Leeks In Water–Cooled Stator Windings", The American Society of Mechanical Engineers 93–JPGC–PWR–26, Oct. 17–22, 1993, (pp. 1–6).

Bruce Faulk, et al., "Diagnosing and Repairing Water Leaks in Stator Windings", Electric Power Research Institute, Jun. 5–6, 1995, (pp. 1–13).

Primary Examiner—Vinh P. Nguyen
Assistant Examiner—Jose M. Solis
Attorney, Agent, or Firm—Oblon, Spivak, McClelland, Maier & Neustadt, P.C.

[57] ABSTRACT

An electric rotating machine comprises a rotor body of cylindrical structure and a stator body covering an outer peripheral portion of the rotor body in a non-contact fashion. The stator body includes a stator winding formed with an insulation layer and arranged radially outward of the rotor body with a clearance from the rotor body and a stator core which supports the stator winding. The electrostatic capacity of the stator winding is measured by an electrostatic capacity measuring instrument which comprises a housing having a size allowing the housing to be accommodated in the clearance between the rotor body and the stator winding, a support body detachably secured to the rotor body and adapted to support the housing within the clearance to be movable, and a measuring element mounted to the housing on the side of the housing facing the stator winding and adapted to measure electrostatic capacity of the stator winding, wherein a degree of water penetration into the insulation of the stator winding is determined based on a measurement data from the measuring element.

9 Claims, 5 Drawing Sheets

ELECTROSTATIC CAPACITY MEASURING INSTRUMENT FOR STATOR WINDING OF ELECTRIC ROTATING MACHINE

BACKGROUND OF THE INVENTION

The present invention relates to an electrostatic capacity measuring instrument for a stator winding of an electric rotating machine or dynamoelectric machine, in particular, capable of measuring electrostatic capacity of the stator winding with a rotor of the electric rotating machine being inserted thereinto.

Some types of known electric rotating machines employ stator windings that are water-cooled, and FIG. 4 shows one example of such a type of electric rotating machine.

In the electric rotating machine comprising a stator 50 and a rotor 51, as shown in FIG. 4, the stator 50 (stator body) is constructed by forming a plurality of slots 54 in a stator iron core 53 attached to a stator frame 52, by disposing a plurality of stator windings 55 (for example, top and bottom bars 55$a$ and 55$b$ in the side view in FIG. 4) in the slots 54 and by inserting stator winding wedges 56 into grooves in the slots 54 (refer to FIG. 3) to secure the stator windings 55 with the stator winding wedges 56, respectively. The electric rotating machine is provided with the rotor 51 that is fitted to the inner peripheral portion of the stator iron core 53, retaining rings 57, 57 are attached on both axial ends of the of the rotor 51. The rotary shafts 58 are rotatably supported by means of bearings to be rotatable about the center axis of the rotor 51. Hereinafter, the rotor 51, the retaining rings 57, and the rotary shafts 58 are collectively referred to as a rotor body.

Discussed next is the insulator structure that performs a water cooling method for the stator windings 55.

As shown in FIGS. 5 and 6, the stator winding 55 comprises a plurality of conductors 60 . . . 60 arranged in bundles, each wire element 60 being covered with an electric insulation 61 such as a mica tape and epoxy resin, and both ends of each conductor 60 are connected to other electrical circuits through clips 62, 62. The conductors 60 are provided with holes 63 . . . 63 that allow cooling water to pass therethrough, and these holes 63 communicate through a pipe joints 64, 64 of the clips 62, with an insulating tube 65 and a cooling water pipe 66 disposed outside the stator frame 52. Thus, the cooling water from the cooling water pipe 66 is supplied to the holes 63 through the insulating tube 65 and the pipe joint 64 of the clip 62 and is then drained to the cooling water pipe 66 through the pipe joint 64 of the clip 62 and the insulating tube 65.

The conductors 60, the clips 62, and the insulating tube 65, all constituting a cooling water passage, are normally connected by means of a brazing method, and the outer surfaces of the brazed connections are covered with the insulation 61 such as the mica tape and epoxy resin.

In order to prevent cooling water from leaking out, the brazed connections of the components constituting water passages are normally put under severe quality control and are subjected to various leakage checking tests to thereby ensure the reliability thereof. After a long time of service, the brazed connections may suffer from peeling, through vibrations, thermal cycles and corrosions, or suffer from pitting corrosion, and cooling water may leak out therethrough, and therefore, during routine inspections, the presence or absence of the leak is determined by checking pressure variations by applying pressure to coils or by conducting a vacuum drop test.

When the cooling water leaks out through the connections (fitting) between each conductor 60 and the clips 62, the leaked cooling water permeates through the insulation 61 by means of capillary action offered by the wrap of the insulating tape of the insulation 61, and if the leaked cooling water reaches the stator iron core 53 side, such an undesirable situation as grounding of the stator windings 55 will take place. Caution must be exercised so that no cooling water may penetrates or ingress into the insulation 61 and it is important to check the leakage at its stage as early as possible.

As a method for checking the penetration or ingress of cooling water into the insulation 61, there is known a method of measuring electrostatic capacity of the insulation 61 of the stator windings 55.

This measuring method is performed in view of the difference in specific dielectric constant between the insulation 61 and cooling water (approximately 1:20), and employs an electrostatic capacity measuring instrument to measure electrostatic capacity of part of the insulation 61 of each stator winding 55 and then statistically determines the presence or absence of the cooling water which penetrates into the insulation 61. Namely, according to this measuring method, the average value and the standard deviation are calculated from electrostatic capacity values with all the stator windings 55, and any of electrostatic capacity values in excess of a predetermined range of variations determines, with that the stator winding 55, that there is a possibility of penetration of the cooling water into the insulation 61.

When the electrostatic capacity measuring instrument is used, variations in the electrostatic capacity values are noticeably large depending on the thickness of the insulation 61 or the presence or absence of voids in the insulation 61, and such variations affect subsequent statistical processing and then determination. Therefore, points of measurement are set up normally where the insulation 61 of the stator windings 55 is uniform in dimension and characteristics. Generally, the insulating layer 61 of the stator windings 55 is manufactured more uniform in distribution and characteristics in its straight portion (namely, in the inner portions thereof in the slots of stator iron core) than its end portion (namely, in the outer portions thereof in the slots of the stator iron core). However, it is impossible to measure the electrostatic capacity in the inner portions of the stator windings in the slots. When the electrostatic capacity measuring apparatus is used, the straight portion of the stator winding 55 of 0.01 to 0.15 m slightly outside the slot is preferred as the point of measurement.

In the prior art electrostatic capacity measuring apparatus described above, since the straight portion of the stator winding as the point of interest for measurement is positioned relatively deep inside the electric rotating machine and closer to the stator iron core with a small separation allowed relative to the rotor, that portion is out of reach of hands as it is, and hence, a measuring element cannot be set therein and the rotor should be taken out of the stator iron core to make measurements.

Since the removal operation of the rotor involves disassembling of bearings and their associated components, it requires a lot of manpower and thus is time consuming. Time required for a routine inspection is prolonged and the routine inspection is relatively costly, and not necessarily efficient enough.

The more the measurement data of electrostatic capacity, the longer time the statistic processing needs and the more frequently computation error takes place. Therefore, an error may be introduced in the determination of the degree of water penetration in the insulation.

SUMMARY OF THE INVENTION

It is an object of the present invention to substantially eliminate defects or drawbacks encountered in the prior art described above and to provide an electrostatic capacity measuring instrument for a stator winding of an electric rotating machine capable of measuring easily and quickly electrostatic capacity of the stator winding without dismantling a rotor from a stator iron core.

It is another object of the present invention to provide an electrostatic capacity measuring instrument for a stator winding of an electric rotating machine capable of determining quickly and accurately the degree of water penetration into an insulation based on measurement data of electrostatic capacity.

These and other objects can be achieved according to the present invention by providing an electrostatic capacity measuring instrument for a stator winding of an electric rotating machine which comprises a rotor body of cylindrical structure and a stator body covering an outer peripheral portion of the rotor body in a non-contact fashion, the stator body including the stator winding formed with an insulation and arranged radially outward of the rotor body with a clearance from the rotor body and a stator core which supports the stator winding, the electrostatic capacity measuring instrument comprising:

a housing having a size allowing the housing to be accommodated in the clearance between the rotor body and the stator winding;

a support body detachably secured to the rotor body and adapted to support the housing within the clearance to be movable; and a measuring element mounted to the housing on the side of the housing facing the stator winding and adapted to measure electrostatic capacity of the stator winding, wherein a degree of water penetration into the insulation of the stator winding is determined based on a measurement data from the measuring element.

In preferred embodiments, the support body is formed of annular member to be attached to the outer peripheral portion of the rotor body.

The electrostatic capacity measuring instrument may further comprise a sliding means for sliding the housing relative to the annular member around the outer peripheral portion of the rotor body, and also, may further comprise a watching device such as charge coupled image pickup device or infra-red camera mounted to the housing and a mechanism for expanding and shrinking the housing in the direction of the axis of the rotor body.

The housing is provided with a press member for pressing the measuring element into contact with a surface of the insulating layer of the stator winding exposed out of the stator core and with a moving member for moving up and down the measuring element in a direction of the radius of the rotor body.

The electrostatic capacity measuring instrument may further comprises a remote control means for remotely controlling an operation of the measuring element, a data collection means for collecting measurement data from the measuring element on a real-time basis, a data storage means for storing the measurement data collected by the data collection means and an algorithm execution means for executing an algorithm for determining the degree of water penetration based on the measurement data stored in the data storage means.

According to the structure of the present invention described above, the electrostatic capacity measuring instrument for the stator winding of an electric rotating machine comprises the housing which has the size that allows the housing to be accommodated into the clearance between the rotor body and the stator winding which are arranged radially outwardly of the rotor body and a support body which movably supports the housing within the clearance. The support body is detachably mounted onto the rotor body and the housing is attached to the support body. The measuring element is mounted to the housing on its side facing the stator winding, thus electrostatic capacity of the stator winding being measured without dismounting the rotor body out of the stator body, the measurement is accordingly no time consuming, and the inspection period and inspection time are shortened. Thus, the inspection efficiency of electrostatic capacity measurement is effectively improved. These advantages subsequently helps shorten the routine inspection intervals, and allows an operator to know predictably the aging trend of the stator winding, and for example, the aging trend may be used to set the replacement time of the stator winding so that the stator winding may be replaced or repaired in advance before a grounding or any other unwanted situation really happens.

Since, in particular, the algorithm of statistic processing and determination is executed on the measurement data that are collected on a real-time basis, numerical processing is performed fast and accurately, and data processing time is substantially reduced. When the quantity of measurement data is large, the present invention is particularly advantageous.

The nature and further features of the present invention will be made more clear from the following descriptions made with reference to the accompanying drawings.

DESCRIPTION OF THE PREFERRED EMBODIMENT

Figure 1:
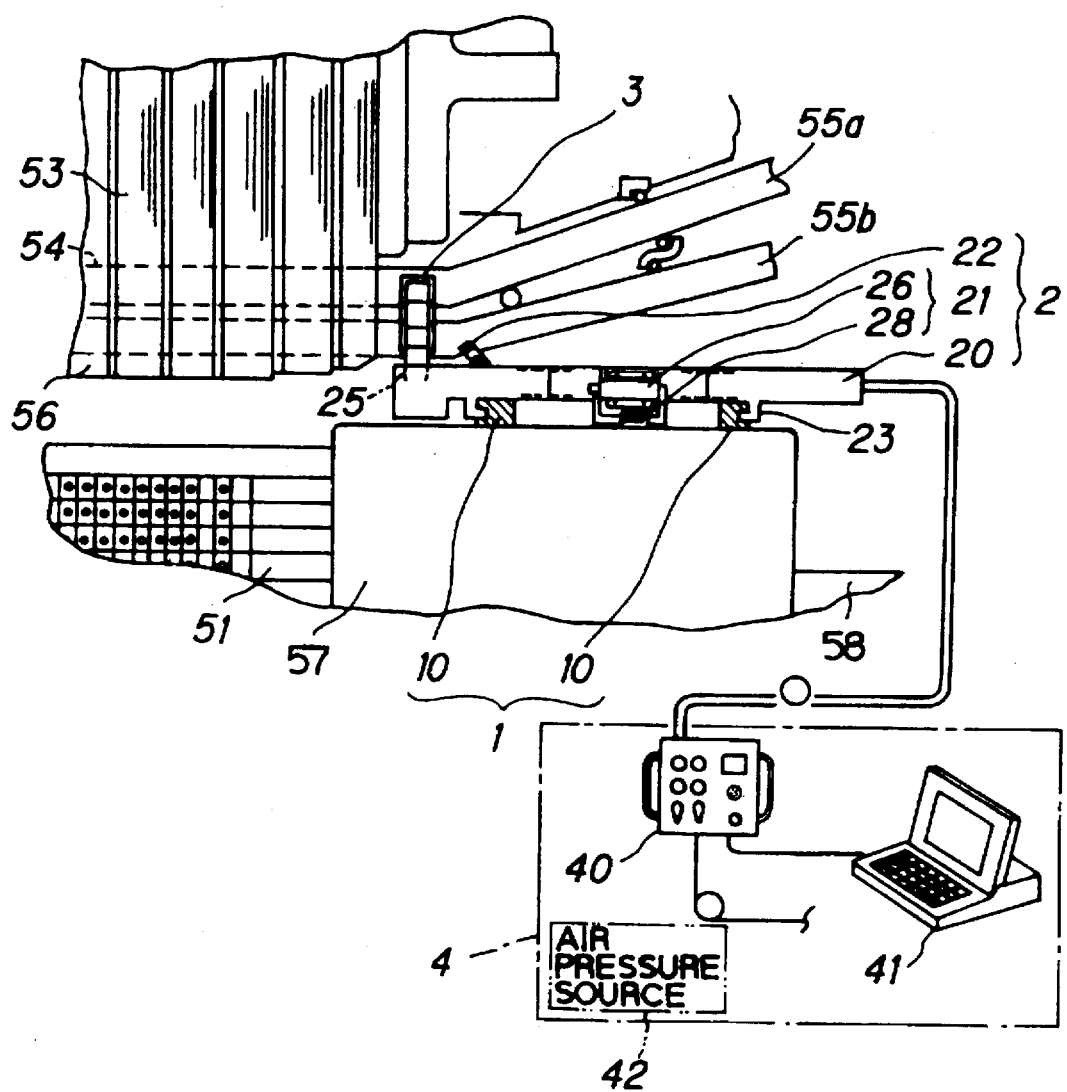
FIG. 1 is a diagrammatic view showing a general structure of an electrostatic capacity measuring instrument for stator winding of an electric rotating machine according to the present invention.
Figure 2:
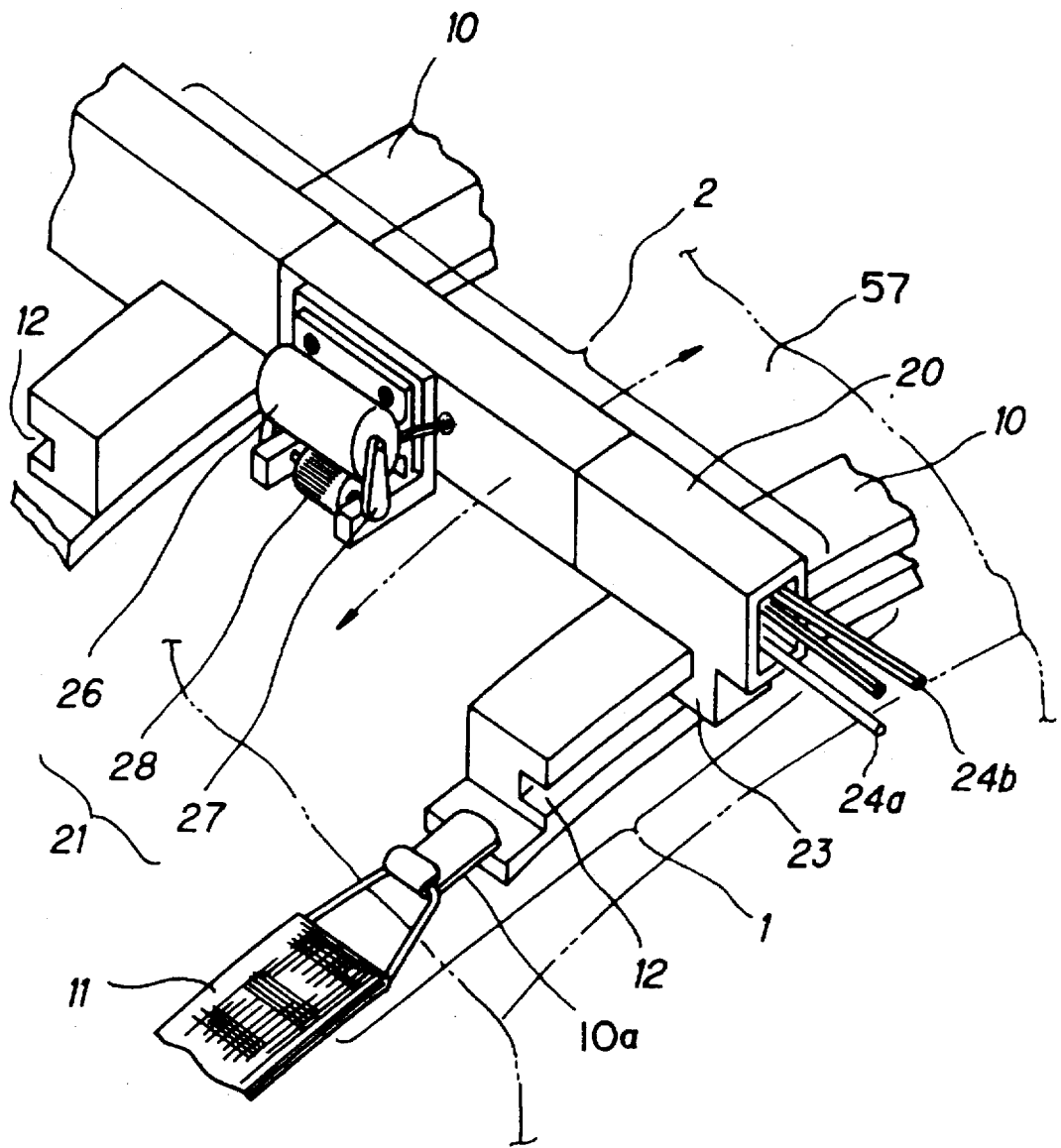
FIG. 2 is a diagrammatic perspective view showing major portions of an instrument mount and an instrument driving block of the measuring instrument of FIG. 1.
Figure 3:
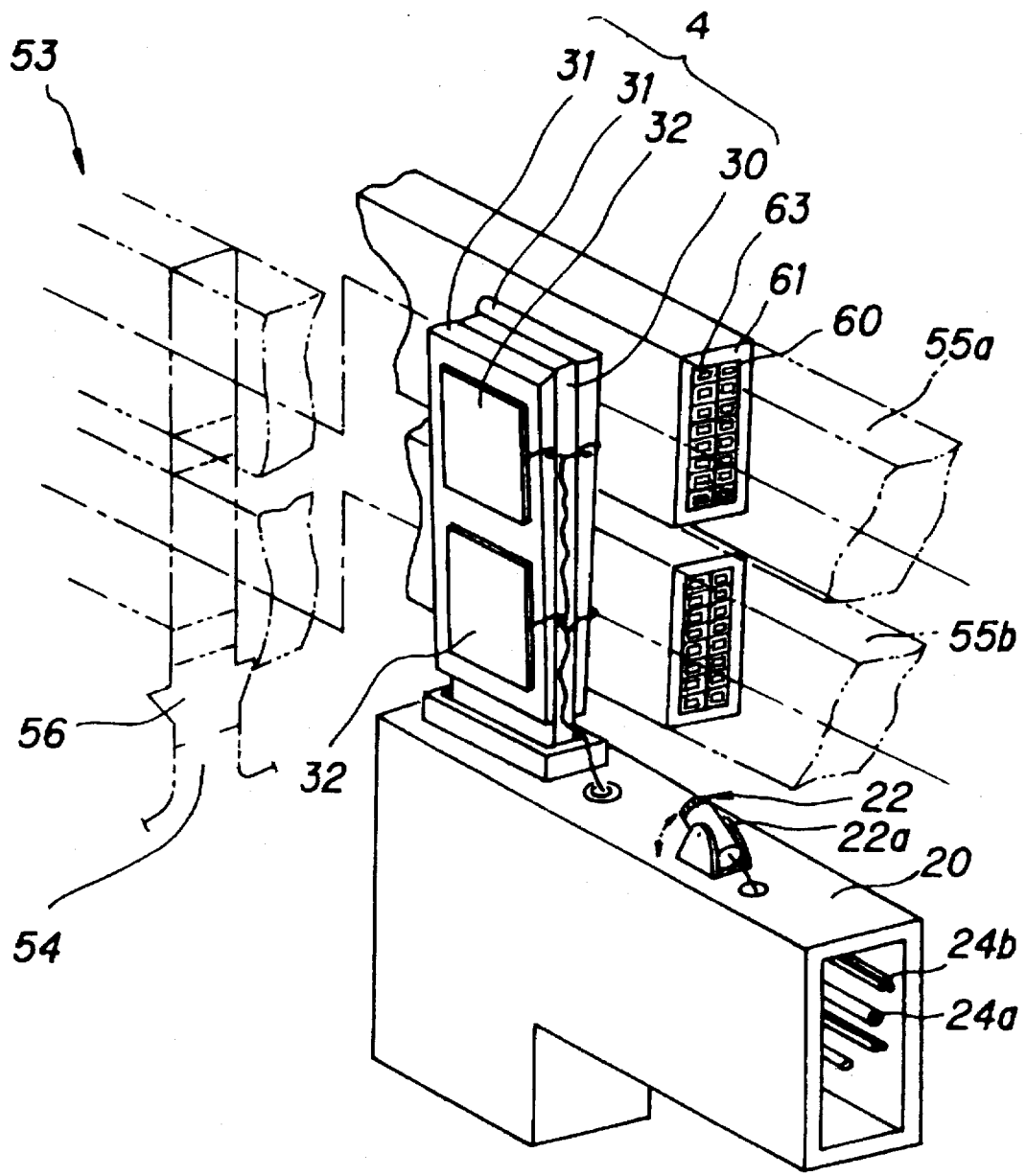
FIG. 3 is a diagrammatic perspective view showing the major portion of the electrostatic capacity measuring block of the measuring instrument of FIG. 1.
Figure 4:
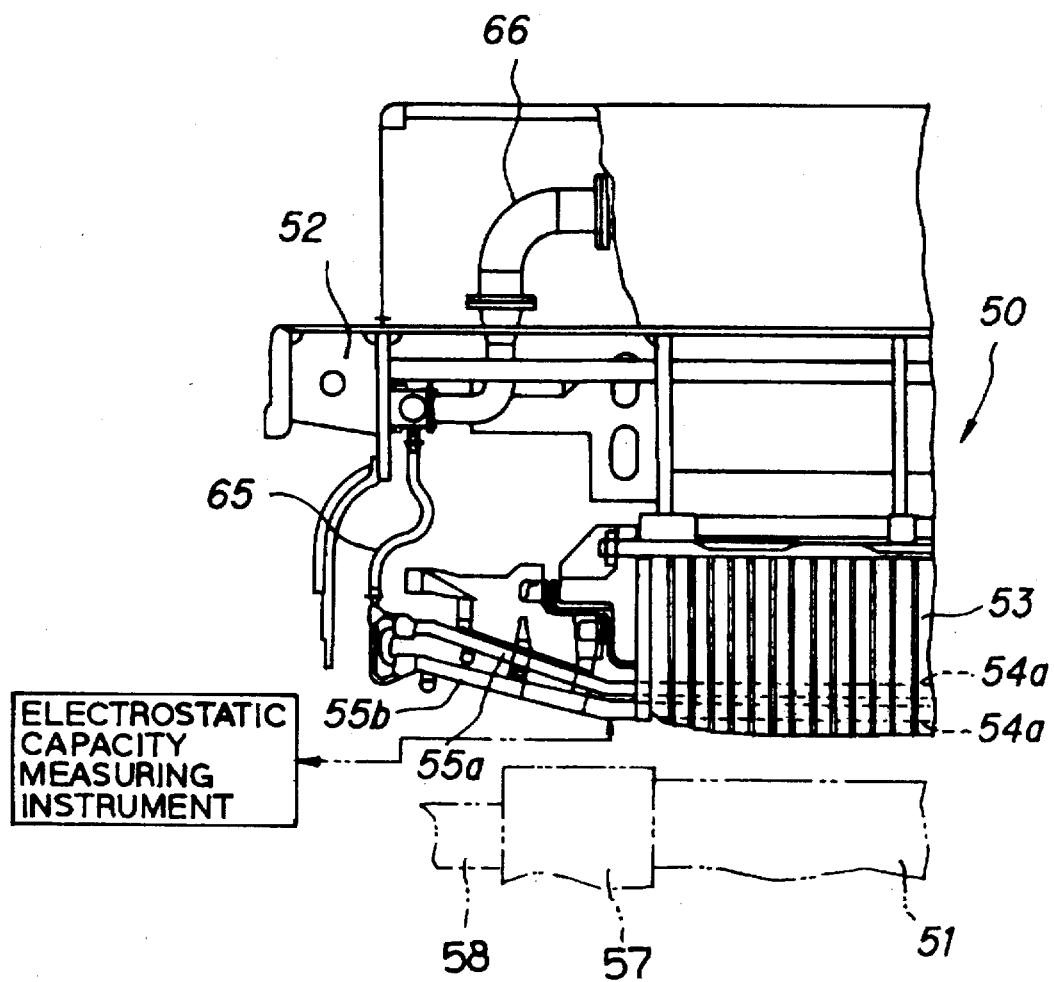
FIG. 4 is an elevational section showing the major portion of a prior art electric rotating machine.
Figure 5:
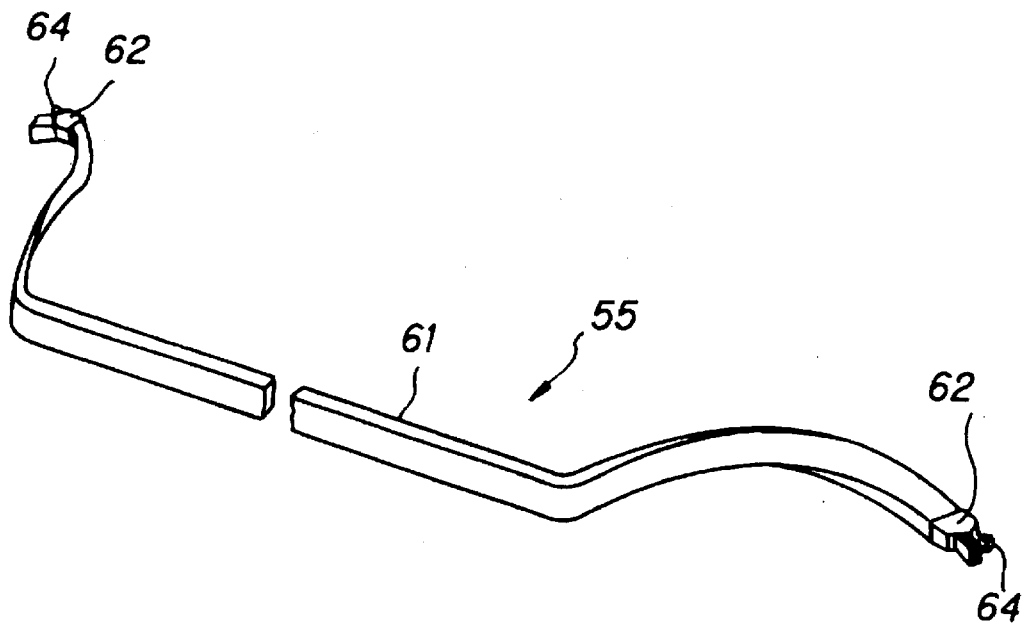
FIG. 5 is a diagrammatic perspective view showing an appearance of a prior art stator winding.
Figure 6:
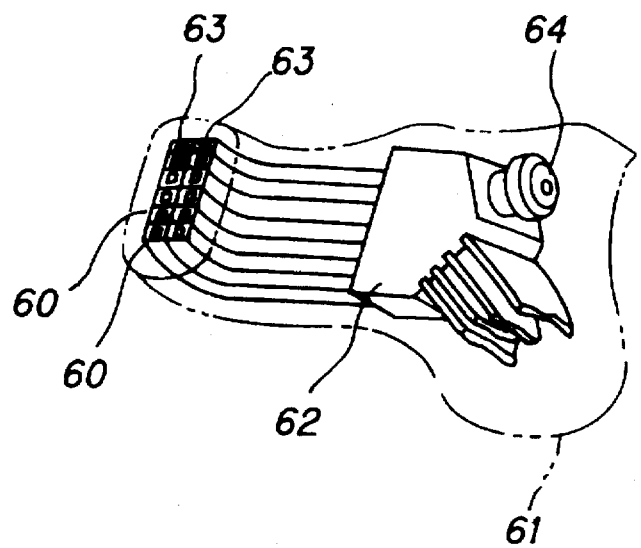
FIG. 6 is a diagrammatic cross-sectional view showing the structure of the major portion of the prior art stator winding.

Referring to FIGS. 1 through 3, one preferred embodiment of the present invention is now discussed, in which the electric rotating machine having the stator windings that are interest in measurement is essentially equivalent to that of the prior art, and accordingly, components equivalent to those mentioned above with reference to FIG. 4 of the prior art are designated with the same reference numerals and their explanation will not be repeated hereunder.

In FIG. 1, the electrostatic capacity measuring instrument for the stator winding of an electric rotating machine comprises an instrument mount 1, constituting the support body in the present invention, which is attached to the outer peripheral surface of retaining rings 57 of a rotor 51, an instrument driving block 2, constituting the major portion of the housing in the present invention, which is movable along the circumferential direction around the retaining rings 57 relative to the instrument mount 1, an electrostatic capacity measuring block 3, constituting part of the housing and the measuring element in the present invention, which, when supported by the instrument driving block 2, measures electrostatic capacity at each of the static windings 55 . . . 55, and a remote control block 4 for driving the instrument driving block 2 and the electrostatic capacity measuring block 3 in a remote control fashion to acquire measurement data.

As shown in FIG. 2, the instrument mount 1 is constructed of a pair of opposing ring-shaped members axially spaced apart on the retaining ring 57 around the outer peripheral portion of the retaining ring 57, and the ring-shaped members are constructed of instrument mounting rings 10, 10 made of soft materials such as Teflon and elastically shrinkable, long, narrow strip-like bands 11, 11 which are attached to the instrument mounting rings 10, 10 through clamps 10a, 10a, and the instrument mount 1 is detachably mounted onto rotors of different diameters within the retaining rings 57 in a manner that allows the instrument mount 1 to be in contact with the outer peripheral portion of the rotor. The two instrument mounting rings 10, 10 are provided, on their outer side ends, with guide grooves 12, 12, respectively.

The instrument driving block 2 comprises a body 20 composed of a column-like member extending in an axial direction of the retaining ring 57, a driving unit 21 for moving the body 20 relative to the instrument mount 1 and a CCD camera or infra-red camera 22 for monitoring.

The body 20 is provided with shoulder portions 23, 23 which extend toward the grooves 12, 12 along the outer sides of the instrument mount 1, and the shoulder portions 23, 23 are received in the grooves 12, 12, and driven by the driving unit 21. The body 20 moves with their shoulder portions 23, 23 to be slidable along the grooves 12, 12 around the outer peripheral surface of the retaining ring 57. The longitudinal length of the body 20 can be adjusted by a known mechanism.

Accommodated in the body 20 are ducts or tubings 24a, including various hoses for supplying and draining air pressure to and from the electrostatic capacity measuring block 3 and their on-off valves, and various conductor wires 24b for electrically connecting the electrostatic capacity measuring block 3 (including the driving unit 21, the CCD camera 22 or infra-red camera and the like) to the remote control block 4. Provided on the side of the end portion of the body 20 facing the stator windings 55 is an opening 25 through which the electrostatic capacity measuring block 3 is moved upward or downward in the direction of the radius of the retaining ring 57.

The driving unit 21, disposed in any convenient location on the body, comprises a drive motor 26 as a power source, a power transmission mechanism 27, comprising a pulley and a belt which are linked to the rotary shaft of the drive motor 26, and a rotational roller 28 linked to the transmission shaft of the power transmission mechanism 27 and having a roller face in contact with the outer peripheral surface of the holder ring. When receiving an operation signal from the remote control block 4, the driving unit 21 transmits power from the drive motor 26 to the rotational roller 28 through the power transmission mechanism 27, and the rotational roller 28, with its rotating force, causes the body 20 to slide along the retaining ring 57.

As shown in FIG. 3, the CCD camera 22 or infra-red camera, which monitors interference conditions mainly between the electrostatic capacity measuring block 3 and associated structural components within the electric rotating machine while the body 20 is moving and which is provided with a tilt mechanism mounted main body 22a onto which an infra-red camera, an optical system and the like are disposed. The orientation of the imaging surface of the the infra-red camera or CCD is directed and adjusted, by allowing the main body 22a to tilt to the shooting direction for imaging a contact condition between the electrostatic capacity measuring block 3 and the stator windings 55. When receiving the operation signal from the remote control block 4, the CCD camera or infra-red camera 22 operates to feed a video signal to the remote control block 4 on a real-time basis.

As shown in FIG. 3, the electrostatic capacity measuring block 3 comprises a support plate 30 connected to the piston of an air cylinder (not shown) in the body 20 and disposed at the opening 24 in the body 20, two pressure bodies 31, 31 bonded to the support plate 30 on its both sides in a manner that the support plate 30 is sandwiched between the pressure bodies 31 wherein the pressure bodies 31 are capable of expanding or shrinking by air pressure, and conductive plastic bodies 32, 32, constituting the measuring element in the present invention, which are mounted on two locations, top and bottom, on each of the exposed surfaces of the two pressure bodies 31, 31.

In response to the power applied through the piston action of the air cylinder, the support plate 30 moves up and down within a predetermined expansion stroke so that the two conductive plastic bodies 32, 32 are adjusted to be respectively at the same levels with the two, top and bottom, stator windings 55a, 55b for measurement. When supplied with compressed air by the remote control block 4 (the source of compressed air pressure to be described later), the air cylinder causes its piston to move up and down.

When supplied with compressed air by the remote control block 4, the pressure bodies 31 expand, pressing the conductive plastic bodies 32, 32 against the surfaces of the insulation of the stator windings 55a, 55b, and then the pressed state is released by draining air pressure to allow the pressure bodies 31 to shrink.

The conductive plastic body 32 is composed of a measuring element capable of measuring electrostatic capacity of the stator windings and has measuring faces of a size capable of measuring the electrostatic capacity of the surfaces of the insulation of the stator windings 55a, 55b. The conductive plastic body 32 serves to convert a measurement signal representing electrostatic capacity that is obtained with the measuring face put into contact with the surface of the insulating layer into measurement data in a digital quantity by an unshown interface (including A/D converter or the like) and then to transfer the measurement data to the remote control block 4.

The remote control block 4 comprises an operator-side control unit 40, constituting the major portion of the remote control block in the present invention for the remote controlling for an operator, a personal computer unit 41 comprising the data collection means, the data storage means, and the major portion of the algorithm execution means in the present invention for processing the measurement data from the electrostatic capacity measuring block 3 for performing various statistical treatments, and an air pressure source 42 such as a compressed air bomb for supplying air pressure to the electrostatic capacity measuring block 3. The remote control block 4 further comprises a monitor for the CCD camera or infra-red camera, and the monitor is set up so as to display the video signal from the CCD camera 22 or infra-red camera on a real-time basis. This monitor may be shared by the personal computer 41.

The operator-side control unit 40 is composed of a control box or operation board for remote control into which control devices such as an operation panel for receiving commands from the operator, switches and buttons are integrated, and when receiving the operation signals from the operator through the control devices, the operator-side control unit 40 transmits predetermined driving signals to the instrument driving block 2 and the electrostatic capacity measuring block 3 and then feeds compressed air to the electrostatic measuring block 3 by controlling the on-off valves of the air pressure source 42.

The personal computer unit 41 is composed of a personal computer having a central processing unit (CPU) as its major component and is set up to perform the algorithm such that the measurement data are collected from the electrostatic capacity measuring block 4 through conductors and an interface on a real-time basis, the measurement data are stored in a storage unit such as a memory, the measurement data stored in the storage unit are subjected to statistic calculation or operation, the measurement data indicating a high probability of cooling water penetration or ingress is determined based on the calculated results such as average values and standard deviations, and the stator winding number and its position that are likely to suffer cooling water ingress are outputted.

The general operation according to the embodiment described above is discussed hereunder.

When a routine inspection is performed on the electric rotating machine, the upper halves of the bearings of the rotor 51 are disassembled and the instrument mount 1 is attached to the outer peripheral portion of the retaining ring 57 with the rotor 51 staying mounted inside the stator iron core 53. In the course of attachment, the instrument mounting rings 10, 10 are mounted so that the bands 11 and the clamps 10a fit the size (radius) of the retaining ring 57.

Next, the instrument driving block 2 is mounted onto the instrument mount 1. In the course of this mounting, the shoulder portions 23, 23 of the body 20 are engaged with the Grooves 12, 12 of the instrument mounting rings 10, 10, respectively.

The electrostatic capacity measuring block 3 is then mounted onto the instrument driving block 2. In the course of this mounting, the expansion stroke of the support plate 30 and the positional relationship between the conductive plastic bodies 32, 32 and the stator windings 55a, 55b are adjusted, and the sizes of the pressure bodies 31, 31 are determined to meet with the separation distance between the stator windings 55a, 55b in a pre-inspection stage.

The instrument mount 1, the instrument driving block 2 and the electrostatic capacity measuring block 3 are mounted between the outer peripheral portion of the retaining ring 57 and the inner peripheral portion of the stator windings 55 in this way, and the measurement of electrostatic capacity is initiated by operating the remote control block 4. Before starting the measurement, the operator-side control unit 31 is operated to feed compressed air from the air pressure source 42 to the electrostatic capacity measuring block 3 so that the air cylinder is operated to thereby raise the support plate 30 to a predetermined height for measurement in view of the levels of the stator windings.

The operator-side control unit 31 is operated to feed the compressed air from the air pressure source 42 to the pressure bodies 31 to allow the pressure bodies 31 to expand and thus to allow the conductive plastic bodies 32, 32 to press against the surfaces of the insulation of the top and bottom stator windings 55a, 55b. Then, the measurement of electrostatic capacity starts. The measurement data of electrostatic capacity are collected by the personal computer unit 41 on a real-time basis and then stored in the memory.

When the measurement of electrostatic capacity is completed, the operator-side control unit 31 is operated to allow air to be drained from the pressure bodies 31 and thus to allow the pressure bodies 31 to shrink, and air pressure is released from the air cylinder to lower the support plate down toward the retaining ring. In this state, by operating the driving unit 21 and the CCD camera or infra-red camera 22, contact conditions with its associated components are monitored while the body 20 is slid between the retaining ring 57 and the stator winding 55, and then the body 20 stops at the position of the next stator winding 55.

Next, the support plate 30 is raised again in the same way as mentioned above, the pressure bodies 31, 31 are expanded to measure electrostatic capacity of the next stator winding 55. Thereafter, this operation is repeated until all the stator windings 55 are measured.

When the stator windings 55 . . . 55 are fully measured in the electrostatic capacity, the CPU performs the algorithm of statistic and determination processing to the measurement data collected by the personal computer unit 41, and a stator winding 55 which is likely to suffer water penetration into the insulating layer 61 is determined in connection with its winding number and position. The statistic and determination processing may be performed concurrently with the measurement data collection. The result of determination is presented on the monitor screen of the personal computer unit 41 in a manner that the operator may easily view it.

Unlike the prior art, according to this embodiment, the electrostatic capacity of the stator windings can be measured in a relatively easy manner without requiring the dismantling of the rotor from the stator iron core, so that a substantial time and manpower involved in the prior art for the dismounting operation of the rotor are eliminated, the inspection period and inspection time are substantially reduced, and electrostatic capacity of the stator windings can be measured quickly and relatively easily. Since the algorithm of statistic processing and determination is executed on the measurement data that are collected on a real-time basis, numerical processing is performed fast and accurately, and data processing time is substantially reduced. In a case where the quantity of measurement data is large, the present invention is particularly advantageous.

The advantage of measuring relatively easily and fast electrostatic capacity may help, for example, shorten the routine inspection intervals, and thus the degradation of the stator winding may be predictably grasped. For example, the degradation may be used to set the replacement time of the stator windings so that the stator windings may be replaced or repaired in advance before a grounding or any other unwanted situation really happens.

What is claimed is:

1. An electrostatic capacity measuring instrument for a stator winding of an electric rotating machine which comprises a rotor body of cylindrical structure and a stator body covering an outer peripheral portion of the rotor body in a non-contact fashion, said stator body including a stator winding formed with an insulation and arranged radially outward of the rotor body with a clearance from the rotor body and a stator core which supports the stator winding, said electrostatic capacity measuring instrument comprising:

a housing having a size allowing the housing to be accommodated in the clearance between the rotor body and the stator winding;

a support body detachably secured to the rotor body and adapted to support the housing within the clearance to be movable; and a measuring element mounted to the housing on the side of the housing facing the stator winding and adapted to measure electrostatic capacity of the stator winding, wherein a degree of water penetration into the insulation of the stator winding is determined based on a measurement data from the measuring element.

2. An electrostatic capacity measuring instrument according to claim 1, wherein the support body is formed of annular member to be attached to the outer peripheral portion of the rotor body.

3. An electrostatic capacity measuring instrument according to claim 2, further comprising a sliding means for sliding the housing relative to the annular member around the outer peripheral portion of the rotor body.

4. An electrostatic capacity measuring instrument according to claim 2, wherein the housing is provided with a press member for pressing the measuring element into contact with a surface of the insulation of the stator winding exposed out of the stator core.

5. An electrostatic capacity measuring instrument according to claim 2, wherein the housing is provided with a moving member for moving up and down the measuring element in a direction of the radius of the rotor body.

6. An electrostatic capacity measuring instrument according to claim 2, further comprising a watching device such as a charge coupled image pickup device or infra-red camera mounted to the housing.

7. An electrostatic capacity measuring instrument according to claim 2, further comprising a mechanism for expanding and contracting the housing in the direction of the axis of the rotor body.

8. An electrostatic capacity measuring instrument according to claim 1, further comprising remote control means for remotely controlling an operation of the measuring element.

9. An electrostatic capacity measuring instrument according to claim 1, further comprising data collection means for collecting measurement data from the measuring element on a real-time basis, data storage means for storing the measurement data collected by the data collection means, and algorithm execution means for executing an algorithm for determining the degree of water penetration based on the measurement data stored in the data storage means.

* * * * *